United States Patent
Lee et al.

(10) Patent No.: US 9,324,665 B2
(45) Date of Patent: Apr. 26, 2016

(54) METAL FUSE BY TOPOLOGY

(71) Applicant: Intel Corporation, Santa Clara, CA (US)

(72) Inventors: Chen-Guan Lee, Hillsboro, OR (US); Walid M. Hafez, Portland, OR (US); Chia-Hong Jan, Portland, OR (US)

(73) Assignee: Intel Corporation, Santa Clara, CA (US)

(*) Notice: Subject to any disclaimer, the term of this patent is extended or adjusted under 35 U.S.C. 154(b) by 39 days.

(21) Appl. No.: 14/142,629

(22) Filed: Dec. 27, 2013

(65) Prior Publication Data

US 2015/0187709 A1  Jul. 2, 2015

(51) Int. Cl.
*H01L 23/62* (2006.01)
*H01L 21/02* (2006.01)
*H01L 21/3205* (2006.01)
*H01L 23/525* (2006.01)

(52) U.S. Cl.
CPC ............ *H01L 23/62* (2013.01); *H01L 21/0217* (2013.01); *H01L 21/32055* (2013.01); *H01L 23/5256* (2013.01); *H01L 2224/16225* (2013.01); *H01L 2924/0002* (2013.01); *H01L 2924/15311* (2013.01)

(58) Field of Classification Search
CPC ...................... H01L 27/11206; H01L 23/5256; H01L 23/62; H01L 29/66818; H01L 21/32055; H01L 21/0217
USPC ............ 257/528, 529; 438/381; 337/158, 159
See application file for complete search history.

(56) References Cited

U.S. PATENT DOCUMENTS

| | | | |
|---|---|---|---|
| 2007/0029576 A1* | 2/2007 | Nowak | H01L 27/10 257/209 |
| 2007/0063310 A1 | 3/2007 | Jeng | |
| 2010/0005649 A1 | 1/2010 | Kim et al. | |
| 2010/0096722 A1 | 4/2010 | Kim et al. | |
| 2012/0044736 A1* | 2/2012 | Chung | G11C 11/1659 365/66 |
| 2012/0187528 A1* | 7/2012 | Cheng | H01L 23/5256 257/529 |
| 2013/0119482 A1* | 5/2013 | Wann | H01L 29/66818 257/401 |
| 2013/0134519 A1* | 5/2013 | Sengoku | H01L 23/5256 257/364 |
| 2013/0175584 A1 | 7/2013 | Ho et al. | |
| 2013/0270559 A1* | 10/2013 | Hafez | H01L 27/11206 257/50 |

OTHER PUBLICATIONS

International Search Report and Written Opinion of the International Searching Authority for International Application No. PCT/US2014/067730, mailed on Feb. 27, 2015, 10 pages.

* cited by examiner

*Primary Examiner* — Kenneth Parker
*Assistant Examiner* — Bo Fan
(74) *Attorney, Agent, or Firm* — Schwabe, Williamson & Wyatt, P.C.

(57) ABSTRACT

Embodiments of the present disclosure describe techniques and configurations for overcurrent fuses in integrated circuit (IC) devices. In one embodiment, a device layer of a die may include a first line structure with a recessed portion between opposite end portions and two second line structures positioned on opposite sides of the first line structure. An isolation material may be disposed in the gaps between the line structures and in a first recess defined by the recessed portion. The isolation material may have a recessed portion that defines a second recess in the first recess, and a fuse structure may be disposed in the second recess. Other embodiments may be described and/or claimed.

25 Claims, 7 Drawing Sheets

METAL FUSE BY TOPOLOGY

FIELD

Embodiments of the present disclosure generally relate to the field of integrated circuits, and more particularly, to techniques and configurations for overcurrent fuses.

BACKGROUND

Fuses are sacrificial devices used in integrated circuits to provide overcurrent protection. When an excessive current is applied to a fuse structure such as a thin metal line, the fuse structure loses conductivity and an open circuit is formed. The amount of current required to form the open circuit depends at least in part on the cross-sectional area of the fuse structure. Fuse structures suitable for use with low program currents have smaller cross-sectional areas than fuses suitable for use with higher program currents. However, conventional fabrication methods produce fuse structures that are at least 20-30 nm wide.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe fuse structures and techniques for forming fuse structures in integrated (IC) circuit devices. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Embodiments described herein include integrated circuit (IC) devices with fuse structures and corresponding fabrication techniques. In various embodiments, a fuse structure may be formed in a device layer or metal layer of a die. In some embodiments, the fuse structure (e.g., a strip of conductive material) may have a desired width, length, thickness, and/or cross-sectional area. Optionally, the dimensions/cross-sectional area for fuse structure may be selected based on a desired maximum current, such that the fuse structure is configured to melt or otherwise form an open circuit in response to the application of a current in excess of the desired maximum current.

In conventional fabrication techniques, photolithography is used to form a trench in a layer of material and a fuse is formed in the trench. The dimensions of the fuse are determined by the dimensions of the trench, and the limitations of photolithography limit the extent to which the width of the trench (and thus the width of the fuse) can be controlled. In contrast, embodiments of fabrication techniques as described herein may be used to form a fuse structure with controlled dimensions as a function of topology. As used herein, the term "topology" refers generally to the spatial arrangement of various surfaces/structural features of a given area (e.g., a device layer or metal layer of a die). For example, in some embodiments, adjacent features (e.g., linear structures and/or line structures, gates) may be formed and/or modified to produce a three-dimensional surface with predetermined dimensions, such that a layer deposited over the adjacent features forms a recess with dimensions that corresponding to the desired dimensions of the fuse structure. Thus, in various embodiments a fuse structure may be formed by producing a corresponding three-dimensional surface and depositing a layer onto the three-dimensional surface to a predetermined thickness in order to form a recess with dimensions that correspond to the desired dimensions of the fuse structure.

Figure 1A:
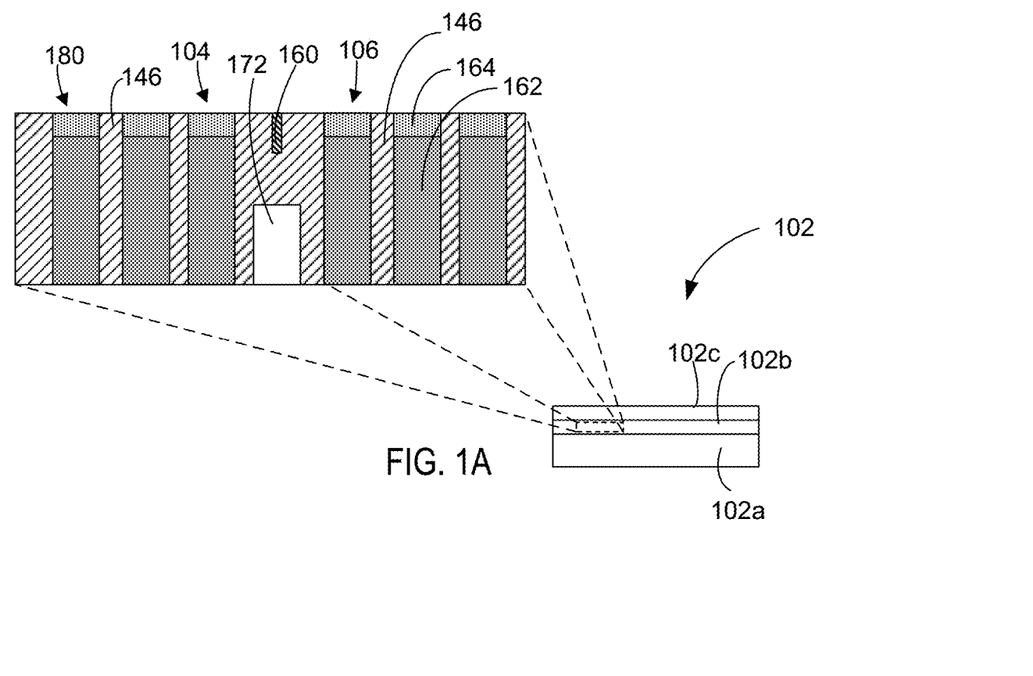
FIG. 1A schematically illustrates a cross-section side view of an example die with a fuse structure in accordance with some embodiments.

FIG. 1A schematically illustrates a side view of an example die 102 with a fuse structure 160, in accordance with some embodiments. In some embodiments, the die 102 may be one of a plurality of dies of a wafer (not shown) composed of semiconductor material such as, for example, silicon or other suitable material. Each of the dies may be a repeating unit of a semiconductor product that includes one or more fuse structures as described herein.

According to various embodiments, die 102 may include a device layer 102b formed on a substrate 102a. The substrate 102a may be a semiconductor substrate composed of semiconductor material systems including, for example, N-type or P-type materials systems. The substrate 102a may include, for example, a crystalline substrate formed using a bulk silicon or a silicon-on-insulator substructure. In some embodiments, the substrate 102a may be formed using alternate materials, which may or may not be combined with silicon, that include but are not limited to germanium, indium antimonide, lead telluride, indium arsenide, indium phosphide, gallium arsenide, or gallium antimonide. Further materials classified as group II-VI, III-V or group IV materials may also be used to form the substrate 102a. In some embodiments, the die 102 may be a singulated die (e.g., die 102 of FIG. 1 or 2) or one die of a wafer (not shown).

Additional details of device layer 102b are shown in the expanded view portion FIG. 1A, in accordance with various embodiments. In some embodiments, device layer 102b may include a first line structure 172 and a fuse structure 160 disposed between two second line structures 104 and 106. First line structure 172 and second line structures 104/106 may be disposed directly on substrate 102a or on one or more layers that are positioned between substrate 102a and line structures 172/104/106. First line structure 172 and second line structures 104/106 or portions thereof may extend generally parallel to one another. Various embodiments may include additional second line structures 180 that are substantially similar or identical to second line structures 104/106. Some or all of the additional second line structures 180 or portions thereof may extend generally parallel to second line structures 104/106 and/or first line structure 172.

Figure 1B:
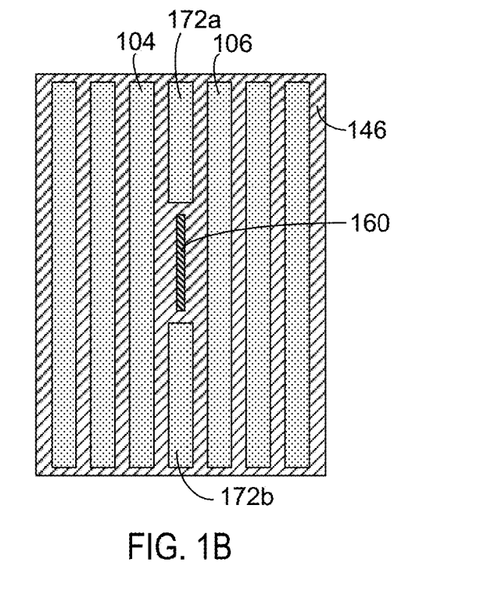
FIGS. 1B-C schematically illustrate a plan view and a perspective view, respectively, of a device layer of an example die and details thereof in accordance with some embodiments.
Figure 1C:
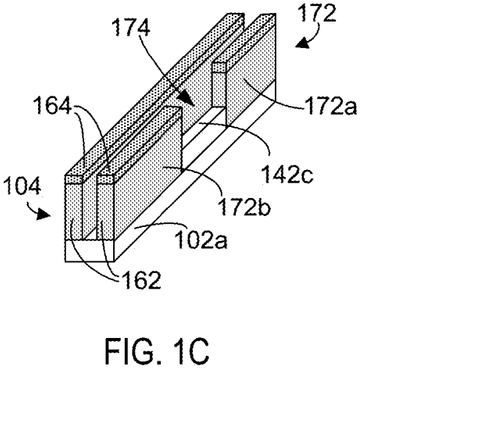

FIGS. 1B-C schematically illustrate a plan view and a perspective view, respectively, of a device layer of an example die (e.g., die 102 of FIG. 1) and details thereof in accordance with some embodiments. As shown for example in FIG. 1C, first line structure 172 may have generally opposite end portions 172a and 172b, and a first recessed portion 142c that defines a first recess 174. End portions 172a/172b may be similar in structure and/or composition to second line structures 104/106. In some embodiments, first recessed portion 142c may have a structure and/or composition that is different from end portions 172a/172b. Some embodiments may lack a first recessed portion 142c.

Figure 11:
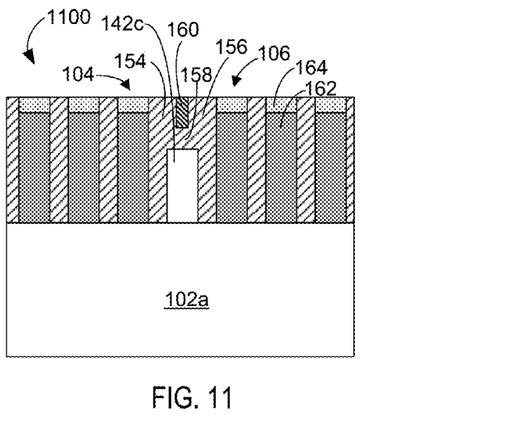
FIG. 11 schematically illustrates a cross-section side view of an example die at another stage of process flow, in accordance with some embodiments.

As best illustrated in FIG. 1B, fuse structure 160 may be disposed between end portions 172a and 172b and between second line structures 104/106. Gaps between adjacent ones of line structures 104, 106, and 172 may be substantially filled with an isolation material 146. Isolation material 146 may also be disposed between the fuse structure 160 and the first recessed portion 142c, and between the fuse structure 160 and second line structures 104 and 106. The isolation material 146 may encapsulate the fuse structure 160. For example, as illustrated in FIG. 11, a first portion of the isolation material 146 may substantially fill a first gap 154 between corresponding surfaces of fuse structure 160 and second line structure 104, a second portion of the isolation material 146 may substantially fill a second gap 156 between corresponding surfaces of fuse structure 160 and second line structure 106, and a third portion of the isolation material 146 may substantially fill a third gap 158 between corresponding surfaces of the fuse structure 160 and first recessed portion 142c of first line structure 172. In some embodiments, the width of first gap 154 may be substantially the same as the width of second gap 156. Thus, the first portion of the isolation material may have a width (from fuse structure 160 to second line structure 104) that is substantially the same as the width of the second portion of isolation material (from fuse structure 160 to second line structure 106). In various embodiments, the third gap 158 may have a height that is substantially equal to the widths of each of the first and second gaps. Thus, the third portion of the isolation material 146 may have a thickness (from first recessed portion 142c to fuse structure 160) that is substantially the same as the widths of each of the first and second portions of the isolation material 146. In some embodiments, the fuse structure 160 may have a top, a bottom, and opposite sides, and the isolation material 146 may extend outwardly to substantially equal distances from each of the sides and bottom of fuse structure 160. For example, the isolation material 146 may extend a given distance (e.g., less than 10 nm, 5-10 nm, 10-15, 14-19 nm) from the bottom of fuse structure 160 to an upper surface of recessed portion 142, and extend the same distance from each side of the fuse structure 160 to the corresponding one of the second line structures 104 or 106.

Referring again to FIG. 1A, each of the second line structures 104/106 may include an electrically inert layer 164 formed on a corresponding gate 162. Likewise, the end portions 172a and 172b of the first line structure 172 may also include an electrically inert layer 164 formed on a corresponding gate 162. The first recessed portion 142c of the first line structure 172 may have a height that is less than the height of second line structures 104/106, and/or less than the height of the end portions 172a/172b, as measured from the substrate 102a. For example, in some embodiments the height of the first recessed portion 142c may be less than the height of the gates 162 of the second line structures 104/106. In other embodiments the height of the first recessed portion 142c may be less than the combined height of the gates 162 and the electrically inert layer 164 of the second line structures 104/106.

In various embodiments, the first recessed portion 142c of first line structure 172 may be polysilicon. In other embodiments, the first recessed portion 142c may be (or may include) amorphous silicon and/or polysilicon-germanium. In still other embodiments, the first recessed portion 142c may be (or may include) any material that has a relatively high etch selectivity to oxide and nitride.

In various embodiments, gates 162 may be formed using an electrically conductive material, such as one or more metals and/or metal alloys. For example, in some embodiments gates 162 may be tungsten. In other embodiments, gates 162 may include one or more of tungsten, copper, nickel, cobalt, aluminum, titanium, and/or a metal alloy material. Electrically inert layer 164 may be an electrically insulating material. For example, in some embodiments electrically inert layer 164 may include silicon nitride. In other embodiments, electrically inert layer 164 may include silicon carbide and/or silicon oxynitride. In still other embodiments, electrically inert layer 164 may include a dielectric material, which may be used as a hardmask to form the second line structures 104, 106 by patterning.

In various embodiments, isolation material 146 may be any electrically conductive material. For example, in some embodiments isolation material 146 may be silicon nitride. In other embodiments, isolation layer 146 may include silicon carbide and/or silicon oxynitride. In still other embodiments, isolation material 146 may include a dielectric material.

In various embodiments, fuse structure 160 may be formed using an electrically conductive material, such as a metal. For example, in some embodiments fuse structure 160 may be tungsten. In other embodiments, fuse structure 160 may include one or more of tungsten, copper, nickel, cobalt, aluminum, titanium, and/or a metal alloy material.

In various embodiments, the device layer 102b may also include one or more transistors formed on the substrate 102a. For example, in some embodiments, the second line structures 104, 106 may serve as gate electrodes/contacts of the one or more transistors. The transistor(s) may include additional features not depicted for the sake of clarity such as device isolation regions, various gate contacts, and the like. The transistor(s) may include a wide variety of types and configurations such as, for example, planar and non-planar transistors such as dual- or double-gate transistors, tri-gate transistors, and all-around gate (AAG) or wrap-around gate transistors, some of which may be referred to as FinFETs (Field Effect Transistors). In some embodiments, the device layer 102b includes one or more transistors or memory cells of a logic device or a memory device, or combinations thereof.

The device layer 102b may also include various other features and components not depicted for the sake of clarity. Examples of such features and components include, but are not limited to, one or more source and/or drain regions (hereinafter "S/D regions") and one or more source and/or drain contacts to route electrical signals to/from the S/D regions.

Electrical signals such as, for example, power and/or input/output (I/O) signals may be routed to and/or from the transistor(s) of the device layer 102b through one or more interconnect layers (e.g., hereinafter "interconnect layers 102c") disposed on the device layer 102b. For example, electrically conductive features of the device layer 102b, such as gates and/or S/D contacts may be electrically coupled with various interconnect structures (e.g., trenches/vias; not shown) of the interconnect layer(s) 102c formed with electrically conductive materials and configured to route electrical signals between the device layer 102b and the interconnect layers 102c. Although a single interconnect layer 102c is depicted in FIGS. 1 and 2, embodiments of the present disclosure also include IC devices having two or more interconnect layers 102c.

While the present disclosure describes fuse structures and related methods of formation in regard to the device layer of a die, it is to be understood that the formation of such fuse structures in other locations is expressly contemplated herein. For example, one or more such fuse structures may be formed/provided in or between one or more of the interconnect layers 102c and/or in other locations such as in a package substrate, circuit board, and/or other components of an integrated circuit (IC) system.

Figure 2:
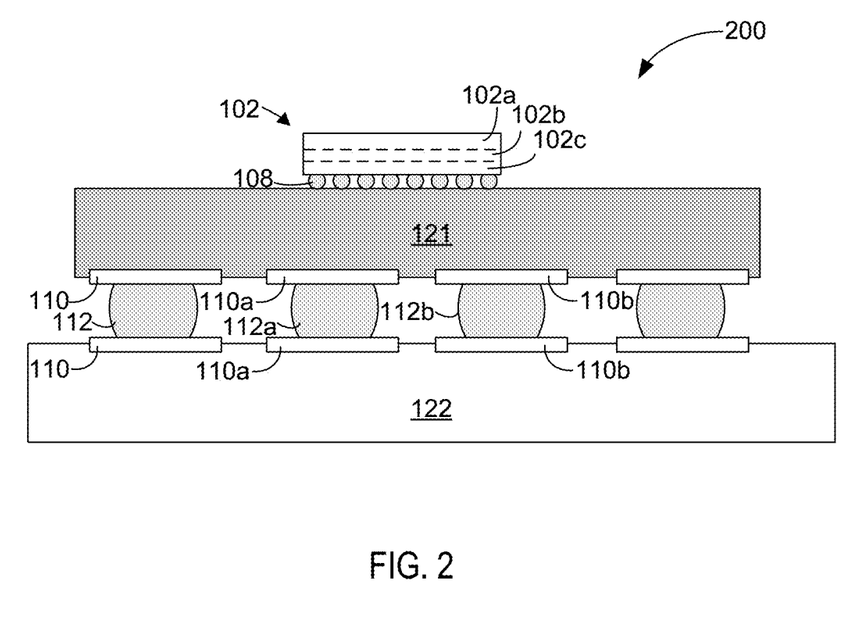
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121 by interconnect structures 108. In various embodiments, interconnect structures 108 may be electrically conductive structures such as bumps, pillars, or other such structures. The die 102 may include one or more line structures and a fuse structure as described herein. In some embodiments, the package substrate 121 may be electrically coupled with a circuit board 122, as can be seen.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, SoC or ASIC in some embodiments. In some embodiments, an electrically insulative material such as, for example, molding compound or underfill material (not shown) may encapsulate at least a portion of the die 102 and/or interconnect structures 108.

The die 102 can be attached to the package substrate 121 according to a wide variety of suitable configurations including, for example, being directly coupled with the package substrate 121 in a flip-chip configuration, as depicted. In some embodiments, interconnect structures 108 may be configured to route electrical signals between the die and package substrate 121. The electrical signals may include, for example, input/output (I/O) signals and/or power/ground signals that are used in connection with operation of the die.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures configured to route electrical signals through the package substrate 121. In some embodiments, the package substrate 121 may include electrical routing features such as pads (not shown) configured to receive the respective interconnect structures 108 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1602 of FIG. 16).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. In some embodiments, one or more first pads 110a may be configured to route the electrical signals routed by a first one of interconnects 108 through solder ball 112a and one or more second pads 110b may be configured to route the electrical signals routed by a second one of interconnects 108 through solder ball 112b. Other suitable techniques to physically and/or electrically couple the package substrate 121 with the circuit board 122 may be used in other embodiments.

The IC assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 100 may be used in some embodiments.

Figure 3:
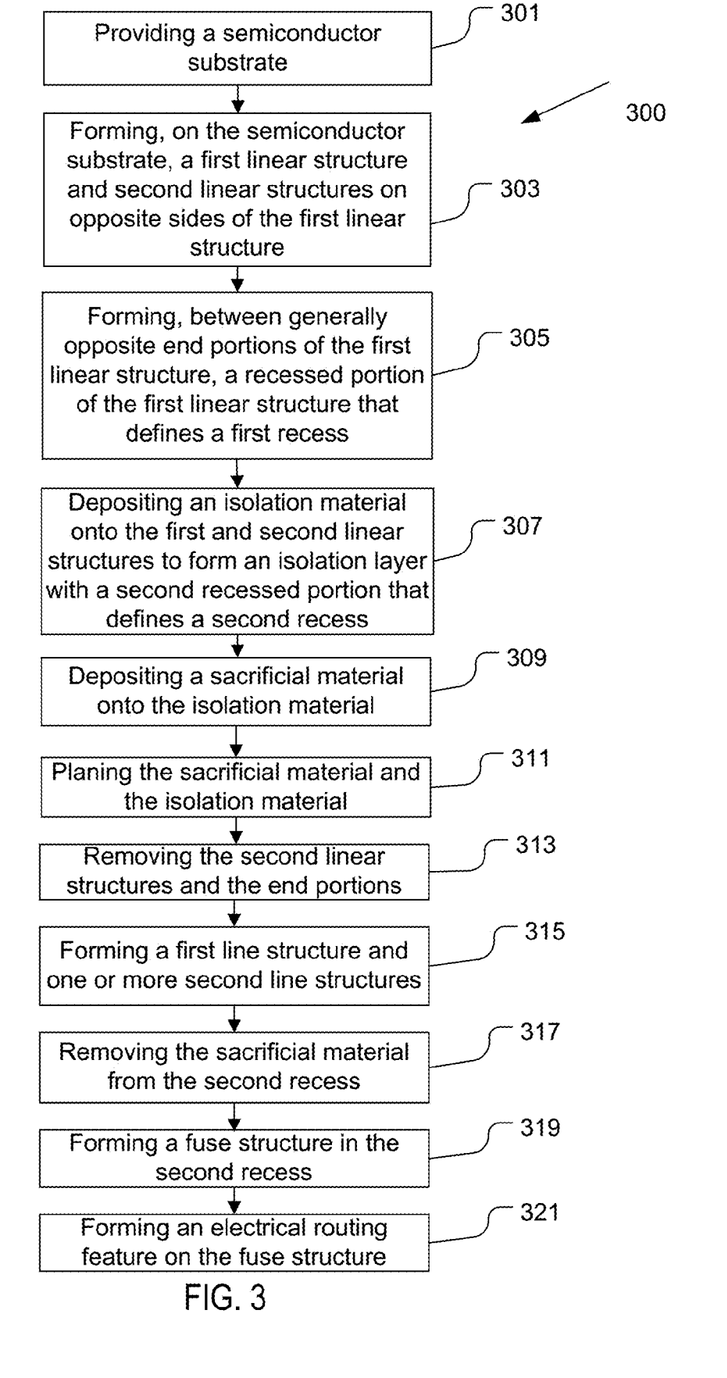
FIG. 3 schematically illustrates a flow diagram for a method of fabricating a fuse structure, in accordance with some embodiments.

FIG. 3 schematically illustrates a flow diagram for a method 300 of fabricating a semiconductor apparatus with a fuse structure, in accordance with some embodiments. FIGS. 4-15 schematically illustrate various stages of a corresponding process flow, in accordance with various embodiments. The method 300 may comport with embodiments described in connection with FIGS. 1-2 and 4-16, and vice versa.

In various embodiments, a conformal isolation layer may be deposited onto an underlying structure/layer with a recessed portion, in order to "shrink" the recess to a desired width of the fuse. Thus, in some embodiments, a method of fabricating a semiconductor apparatus with a fuse structure may include forming a recess in a structure/layer of the semiconductor apparatus, such as by lithography or other technique(s), depositing a conformal isolation layer onto the structure/layer to form a smaller second recess within the first recess, and depositing an electrically conductive material into the fuse structure in the second opening. In some embodiments, as described in further detail below, the structure/layer onto which the conformal isolation layer is deposited may include one more sacrificial structures (e.g., linear structures as described herein), and the method may include forming the sacrificial structure(s) and replacing the sacrificial structure(s) with conductive gates or other non-sacrificial structures (e.g., line structures 104, 106, and 172). Alternatively, in other embodiments of the method, the semiconductor apparatus with the fuse structure may be formed without forming sacrificial structures. For example, in some embodiments the method may include forming the non-sacrificial structures and depositing the conformal isolation layer onto the non-sacrificial structures. As another example, in other embodiments the method may include forming an isolation layer on the substrate, forming openings in the isolation layer (e.g., by lithography or other techniques), and forming the non-sacrificial structures in the openings in the isolation layer.

In various embodiments, methods as described herein may enable the formation of a fuse structure (e.g., fuse structure 160) with a smaller cross-sectional area and/or more controllable dimensions than conventional techniques. In some embodiments, the methods described herein may be used to control the thickness and the width of the fuse structure. For example, in some embodiments, conformal deposition of isolation material may be used to control the width of the fuse structure, and a dry etch process may be used to recess an underlying structure and to thereby control the thickness of the fuse structure.

At 301, the method 300 may include providing a semiconductor substrate (e.g., semiconductor substrate 102a described herein). In some embodiments, the semiconductor substrate may include a substrate of a system-on-chip (SoC) configuration.

At 303, the method 300 may include forming, on the semiconductor substrate, a first linear structure and second linear structures on opposite sides of the first linear structure. FIGS. 4-7 illustrate various stages of an example process flow corresponding to 303.

In various embodiments, the first linear structure (e.g., first linear structure 142 of FIG. 7) and the second linear structures (e.g., second linear structures 144 of FIG. 7) may be formed simultaneously on the semiconductor substrate (e.g., substrate 102a). In other embodiments, the first and second linear structures may be formed sequentially and/or at different times.

Figure 4:
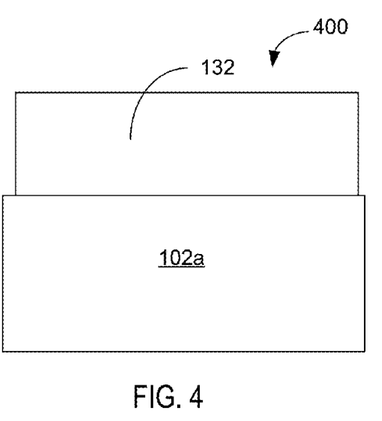
FIG. 4 schematically illustrates a cross-section side view of an example die at a stage of process flow, in accordance with some embodiments.
Figure 5:
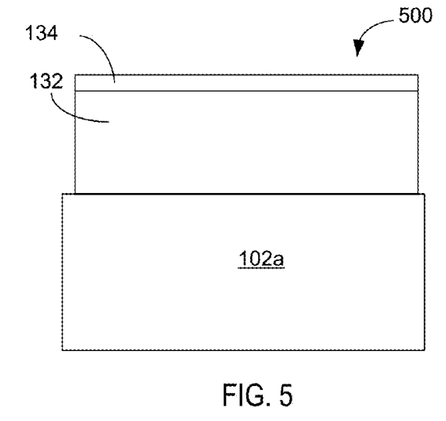
FIG. 5 schematically illustrates a cross-section side view of an example die at another stage of process flow, in accordance with some embodiments.
Figure 6:
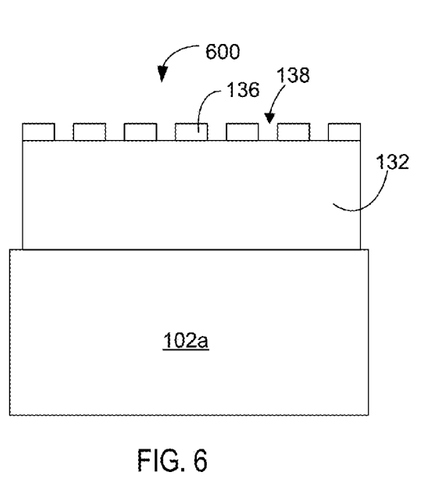
FIG. 6 schematically illustrates a cross-section side view of an example die at another stage of process flow, in accordance with some embodiments.
Figure 7:
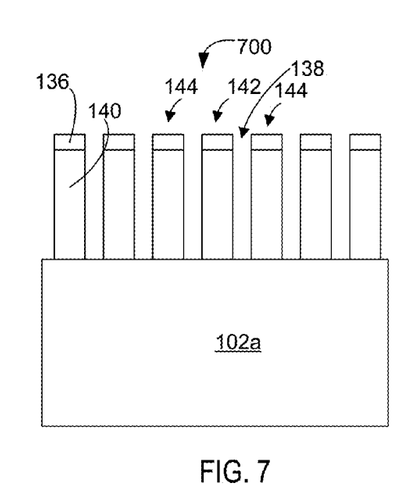
FIG. 7 schematically illustrates a cross-section side view of an example die at another stage of process flow, in accordance with some embodiments.

In some embodiments, forming the first and second linear structures may include forming a first layer of polysilicon, dielectric, or other suitable material (e.g., first layer 132, FIG. 4) on the semiconductor substrate (e.g., substrate 102a, FIG. 4). Optionally, a hard mask may be formed on the first layer (e.g., hard mask 134, FIG. 5). The hard mask may be patterned using photolithography or other suitable techniques to create openings in the hard mask (e.g., gaps 138, FIG. 6). As illustrated for example in FIG. 7, the openings may be extended toward the substrate (e.g., substrate 102a) with photolithography and/or an etch process (e.g., a dry etch process) to form a plurality of linear structures (e.g., linear structures 142, 144) spaced apart by gaps (e.g., gaps 138). As a result, some or all of the resulting linear structures may include a base structure (e.g., base structure 140) and a hard mask cap (e.g., cap 136) coupled with the base structure. Thus, in various embodiments, the base structures may formed from the first layer (e.g., first layer 132) and the caps may be formed from the second layer (e.g., second layer 134), respectively. In other embodiments, the first and second linear structures may be formed by any other suitable process/technique.

Figure 8A:
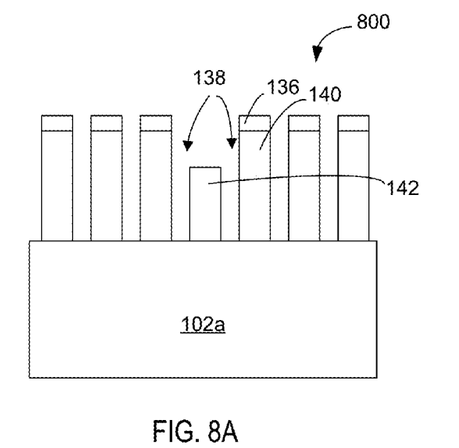
FIGS. 8A-B schematically illustrate a cross-section side view of an example die at another stage of process flow and perspective view of details thereof, in accordance with some embodiments.
Figure 8B:
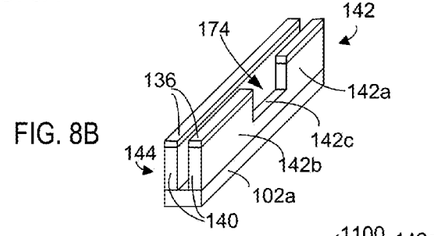

At 305, the method 300 may include forming, between generally opposite end portions of the first linear structure, a recessed portion of the first linear structure that defines a first recess. FIGS. 8A-8B illustrate a stage of an example process flow corresponding to 305, in accordance with various embodiments.

In various embodiments, the recessed portion (e.g., first recessed portion 142c, FIG. 8B) may be formed between the two generally opposite end portions (e.g., end portions 142a and 142b, FIG. 8B) of the first linear structure (e.g., linear structure 142, FIGS. 8A-8B). The recessed portion may define a first recess (e.g., first recess 174, FIG. 8B). In various embodiments, 303 and 305 may be performed simultaneously or in any order.

Figure 12:
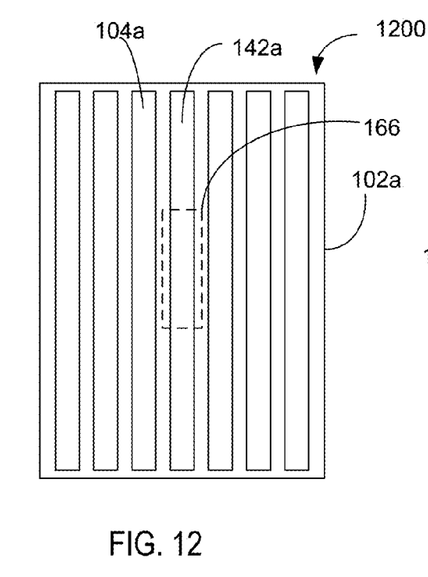
FIG. 12 schematically illustrates a top view of an example die at another stage of process flow, in accordance with some embodiments.
Figure 13:
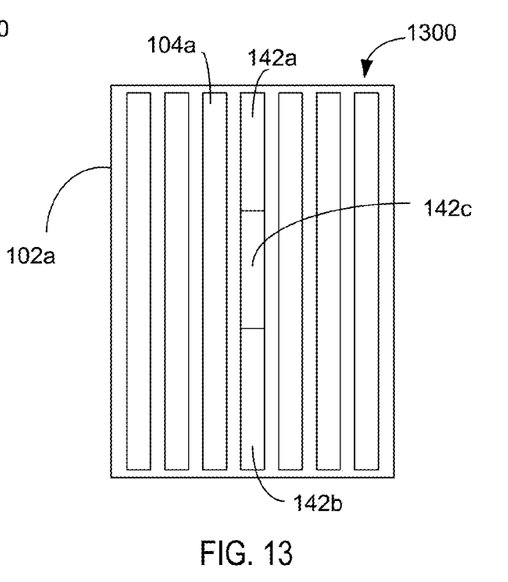
FIG. 13 schematically illustrates a top view of an example die at another stage of process flow, in accordance with some embodiments.

In various embodiments, the recessed portion (e.g., first recessed portion 142c, FIG. 8B) may be formed in the first linear structure by using photolithography or other suitable techniques to remove a portion of the hard mask (e.g., cap 136) along the first linear structure in a target area (e.g., target area 166, FIG. 12). Optionally, a portion of the underlying first layer (e.g., first layer 132) may also be removed using a dry etch process or other suitable technique to form the first recessed portion, as shown for example in FIGS. 8A, 8B, and 13.

Figure 9:
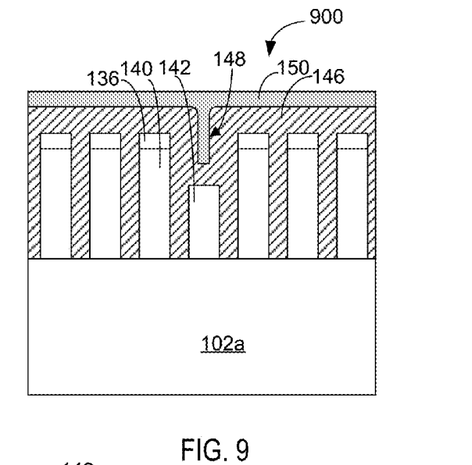
FIG. 9 schematically illustrates a cross-section side view of an example die at another stage of process flow, in accordance with some embodiments.

At 307, the method 300 may include depositing an isolation material onto the first and second linear structures to form an isolation layer with a second recessed portion that defines a second recess. FIG. 9 illustrates a stage of an example process flow corresponding to 307 and 309, in accordance with various embodiments.

In various embodiments, the isolation material (e.g., isolation material 146, FIG. 9) may be deposited on the first and second linear structures using a conformal deposition technique (e.g., atomic layer deposition, plasma enhanced chemical vapor deposition). The isolation material may substantially fill the gaps between the first recessed portion and adjacent ones of the second linear structures. In some embodiments, conformal deposition of the isolation material may result in the formation of an isolation layer that has substantially the same thickness on each of the two second linear structures adjacent to the first linear structure. As shown for example in FIG. 9, the thickness of the isolation material on each of these two second linear structures may be less than half of the distance between the two second linear structures. As a result, the isolation material/layer may have a second recessed portion (e.g., second recessed portion 148) between the two second linear structures. The second recessed portion may define a second recess (e.g., second recess 152, FIG. 10) within the first recess.

One or more of the dimensions of the second recessed portion/second recess may depend on a thickness of deposition of the isolation material, the depth of the first recess in the first linear structure, or a combination of both. For example, in some embodiments, the thickness of the fuse structure may be a function of the depth of the first recessed portion, and the width of the fuse structure may be a function of the depth of deposition of the isolation material. Thus, in various embodiments, a fuse structure with a desired thickness and width may be formed by controlling the depth of the first recessed portion and the depth of deposition of the isolation material.

At 309, the method 300 may include depositing sacrificial material (e.g., sacrificial material 150, FIG. 9) onto the isolation material. The sacrificial material may vary among embodiments. In some embodiments, the sacrificial material may be a flowable oxide. In other embodiments, the sacrificial material may a polymer or other suitable material. Optionally, the sacrificial material may be applied in the form of a viscous liquid. In some embodiments, the sacrificial material may substantially fill the second recess.

Figure 10:
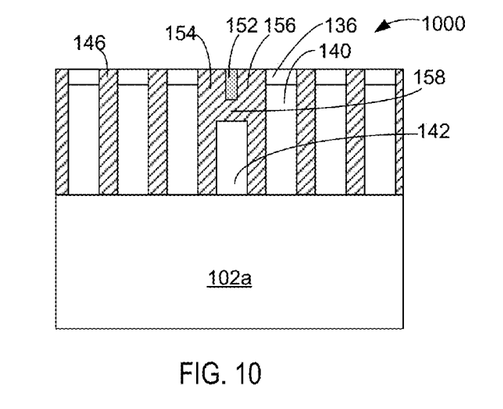
FIG. 10 schematically illustrates a cross-section side view of an example die at another stage of process flow, in accordance with some embodiments.

At 311, the method 300 may include planing the sacrificial/ isolation material to expose the linear structures. FIG. 10 illustrates a corresponding stage of process flow, in accordance with various embodiments. In some embodiments, a portion of the sacrificial material and the isolation material may be removed to expose one or more of the linear structures by polishing the sacrificial material and the isolation material with slurry.

In various embodiments, at 313 the method 300 may further include removing the second linear structures and the end portions of the first linear structure. In some embodiments, the second linear structures and the end portions may be removed by photolithography, etch process(es), and/or any other suitable technique. For example, in some embodiments an upper portion of the linear structures and the end portions (e.g., caps 136, FIG. 8A and/or remaining portions of second layer 134) may be removed using a dry etch technique and a lower portion of the linear structures (e.g., or remaining portions of first layer 132) may be removed using a wet etch technique. In any case, the first recessed portion 142c may remain in place between the isolation material 146 and the substrate 102a once the second linear structures and the end portions of the first linear structures are removed. Removing the second linear structures and the end portions of the first linear structure may leave corresponding openings (not shown) in the isolation material 146.

FIG. 11 illustrates a stage of an example process flow corresponding to 315, 317, and 319 of the method 300, in accordance with various embodiments. At 315, the method 300 may include forming a first line structure and one or more second line structures. In some embodiments, forming the second line structures (e.g., second line structures 104/106/180, FIGS. 1A, 1C, 11). may include depositing a conductive material such as one or more metals into the openings formed by removal of the second linear structures. Similarly, forming the first line structure (e.g., first line structure 172, FIG. 1C) may include depositing the same or a different conductive material into the openings formed by removal of the end portions of the first linear structure. In various embodiments, the first recessed portion (e.g., first recessed portion 142c, FIG. 1C) of the first linear structure may be retained to form part of the first line structure.

In various embodiments, the conductive material may form conductive structures such as gates (e.g., gates 162). In some embodiments, forming the first and second line structures may further include forming an electrically insulating layer (e.g., electrically inert layer 164) on the conductive material/ gates. For example, in some embodiments the conductive structures/gates may be formed by using a conformal deposition technique to deposit one or more metals or other conductive material(s) into the second recess. In various embodiments the electrically insulating layer may be formed using the same technique or any other suitable technique to deposit silicon nitride, a dielectric material, or other electrically insulating/inert material onto the conductive material/gates.

Optionally, a polishing process may be performed after forming the conductive structures/gates and prior to forming the electrically insulating layer, or after forming the electrically insulating layer, or both.

At 317, the method 300 may include removing the sacrificial material from the second recess. In various embodiments, the sacrificial material may be removed from the second recess may include using a wet etch process (e.g., with hydrogen fluoride) or other suitable technique.

Figure 14:
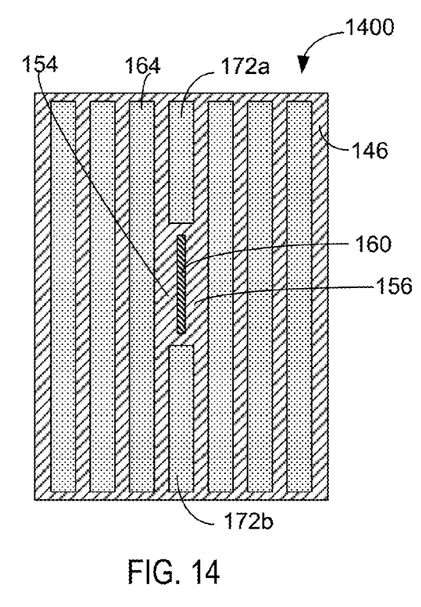
FIG. 14 schematically illustrates a top view of an example die at another stage of process flow, in accordance with some embodiments.

At 319, the method 300 may include forming a fuse structure (e.g., fuse structure 160) in the second recess. FIGS. 11 and 14 illustrate a corresponding stage of process flow, in accordance with various embodiments. In some embodiments, the fuse structure may be formed by using a conformal deposition technique to deposit one or more metals or other conductive material(s) into the second recess. Optionally, a polishing process may be performed after forming the fuse structure.

Figure 15:
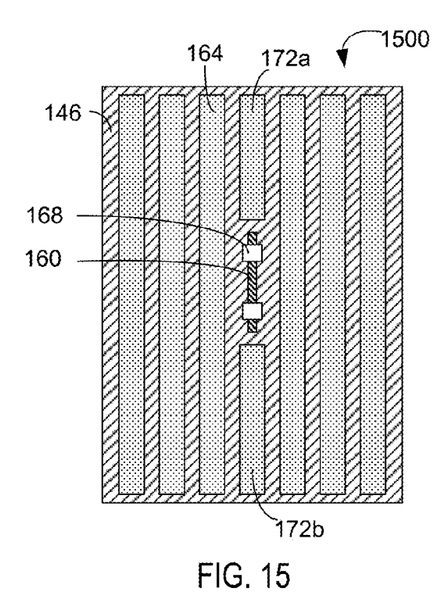
FIG. 15 schematically illustrates a top view of an example die at another stage of process flow, in accordance with some embodiments.

Optionally, at 321, the method 300 may include forming an electrical routing feature on the fuse structure. FIG. 15 illustrates a corresponding stage of an example process flow, in accordance with various embodiments. In some embodiments, one or more electrical routing features (e.g., electrical routing features 168, FIG. 15) may be formed on the fuse structure (e.g., fuse structure 160, FIGS. 1A-B, 11, 14, 15). The electrical routing feature(s) may be, but is/are not limited to, electrically conductive pads, nanowires, metal-filled vias, and other such electrically conductive features. The number, dimensions, and composition of the electrical routing feature(s) may vary among embodiments.

In various embodiments, at 321 the method 300 may further include forming one or more die interconnect layers (e.g., die interconnect layer(s) 102*c*, FIGS. 1A, 2) on the electrical routing feature(s). In some embodiments, the electrical routing feature(s) may be disposed in the device layer of a die (e.g., device layer 102*b* of die 102, FIGS. 1A, 2). In other embodiments, the electrical routing feature(s) may be disposed in a die interconnect layer of the die (e.g., die interconnect layer(s) 102*c* of die 102, FIGS. 1A, 2).

Again, in some embodiments the semiconductor apparatus may be fabricated without forming sacrificial structures (e.g., linear structures 142/144) or replacing sacrificial structures with non-sacrificial structures (e.g., line structures 104, 106, and 172). Thus, in various embodiments any or all of 301, 303, and 305 may be omitted. For example, in some embodiments the first and second line structures may be formed on the substrate and the isolation material may be deposited onto the first and second line structures (e.g., at 307). In other embodiments, the isolation material may be deposited onto the substrate and patterned to create openings in the isolation layer, and the first and second line structures may be formed in the openings. In still other embodiments, the recessed portion of the first line structure may be formed on the substrate, the isolation material may be deposited onto the recessed portion and the substrate and patterned to create openings in the isolation layer, and the second line structures and the opposite ends of the first line structure may be formed in the openings. In still other embodiments, the second line structures and the opposite ends of the first line structure may be formed on the substrate, the isolation material may be deposited onto those structures and the substrate and patterned to create an opening in the isolation layer between the opposite ends of the first line structure, and the recessed portion of the first line structure may be formed in the opening.

In some embodiments, the dimensions of the first recessed portion and/or linear/line structures may be controlled to form a second recess with particular dimensions in order to enable the formation of a fuse structure with corresponding dimensions. For example, relatively narrower fuse structures may be produced by forming a thicker isolation layer and/or by decreasing the size of the gap between the secondary linear/line structures. As another example, the thickness of the fuse structures may be controlled by controlling the depth of the first recess in the first linear/line structure.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 16:
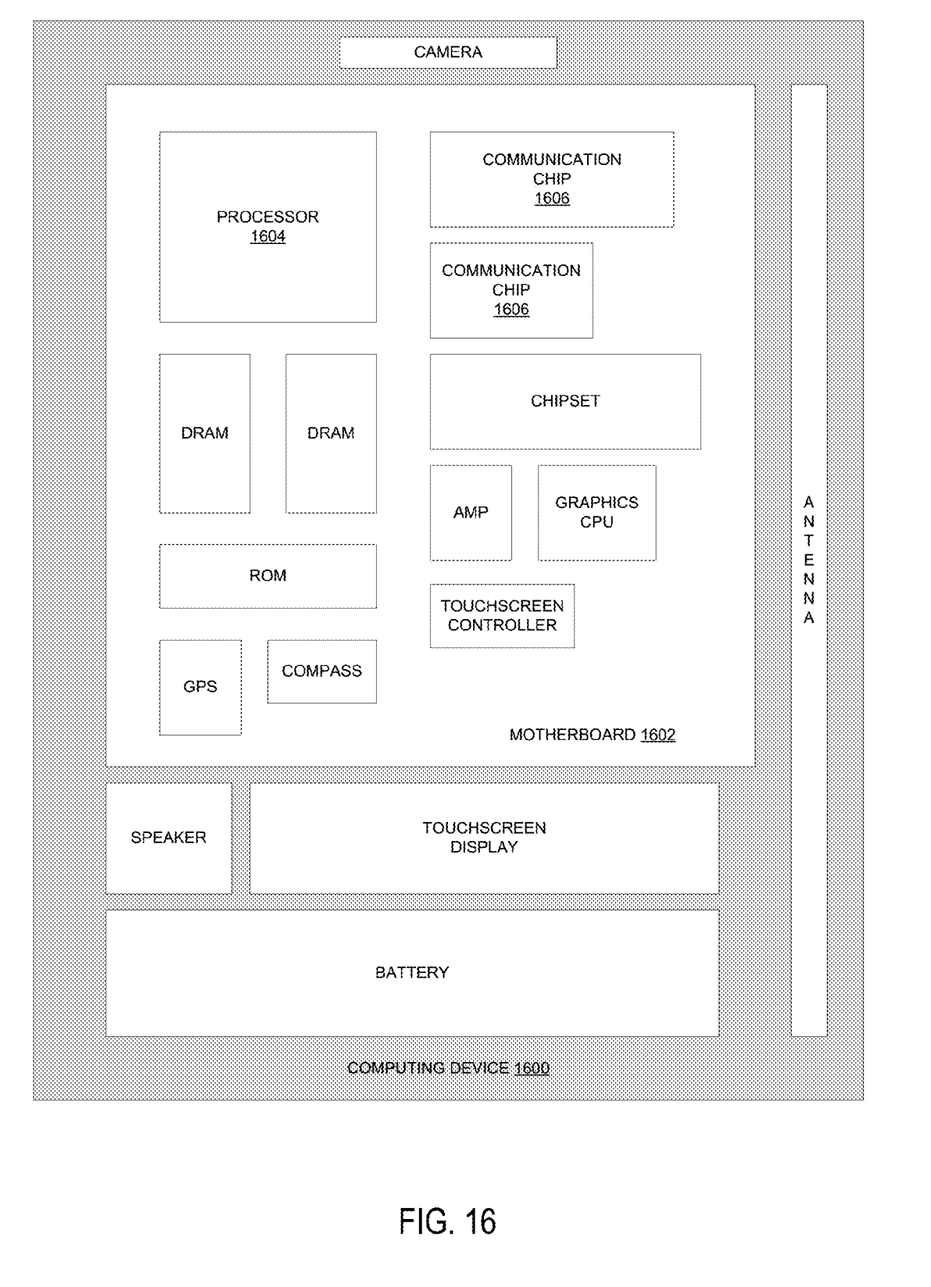
FIG. 16 schematically illustrates an example system that may include a fuse structure as described herein, in accordance with some embodiments.

FIG. 16 schematically illustrates an example system (e.g., computing device 1600) that may include a fuse structure as described herein, in accordance with some embodiments. The computing device 1600 may house a board such as motherboard 1602. The motherboard 1602 may include a number of components, including but not limited to a processor 1604 and at least one communication chip 1606. The processor 1604 may be physically and electrically coupled to the motherboard 1602. In some implementations, the at least one communication chip 1606 may also be physically and electrically coupled to the motherboard 1602. In further implementations, the communication chip 1606 may be part of the processor 1604.

Depending on its applications, computing device 1600 may include other components that may or may not be physically and electrically coupled to the motherboard 1602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1606 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1606 may operate in accordance with other wireless protocols in other embodiments.

The computing device 1600 may include a plurality of communication chips 1606. For instance, a first communication chip 1606 may be dedicated to shorter range wireless communications such as Wi-Fi and Bluetooth and a second communication chip 1606 may be dedicated to longer range wireless communications such as GPS, EDGE, GPRS, CDMA, WiMAX, LTE, Ev-DO, and others.

The processor 1604 of the computing device 1600 may include a die (e.g., die 102 of FIGS. 1-2) having a fuse structure as described herein. For example, the die 102 of FIGS. 1-2 may be mounted in a package assembly that is mounted on the motherboard 1602. The term "processor" may refer to any device or portion of a device that processes electronic data from registers and/or memory to transform that electronic data into other electronic data that may be stored in registers and/or memory.

The communication chip 1606 may also include a die (e.g., die 102 of FIGS. 1-2) having a fuse structure as described herein. In further implementations, another component (e.g., memory device or other integrated circuit device) housed within the computing device 1600 may contain a die (e.g., die 102 of FIGS. 1-2) having a fuse structure as described herein.

In various implementations, the computing device 1600 may be a mobile computing device, laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1600 may be any other electronic device that processes data.

EXAMPLES

According to various embodiments, the present disclosure describes an apparatus (e.g., integrated circuit (IC) assembly) comprising a semiconductor substrate, a first line structure disposed on the semiconductor substrate, a second and a third line structure disposed on the semiconductor substrate along opposite sides of the first line structure, an isolation layer, and a fuse structure. In various embodiments, the first line structure may have two end portions and a first recessed portion between the two end portions. The recessed portion may define a first recess, and the recessed portion may be disposed between the first recess and the semiconductor substrate. In various embodiments, the second and third line structures may be spaced apart from the first line structure to define a first gap between the second line structure and the first line structure and a second gap between the third line structure and the first line structure. In various embodiments, the isolation layer may be disposed in the first gap and the second gap and further disposed in the first recess. In various embodiments, the isolation layer may have a second recessed portion defining a second recess in the first recess. In various embodiments, the fuse structure may be disposed in the second recess, and a portion of the isolation layer may be disposed between the fuse structure and the first line structure.

In various embodiments, the portion of the isolation layer may be a first portion, and a second portion of the isolation layer may be disposed between the fuse structure and the second line structure. In various embodiments, a third portion of the isolation layer may be disposed between the fuse structure and the third line structure. In various embodiments, a surface of the fuse structure may be generally co-planar with a surface of the isolation layer that is farthest from the semiconductor substrate. In various embodiments, a distance between the fuse structure and the second line structure and a distance between the fuse structure and the third line structure may be substantially the same.

In various embodiments, the fuse structure may have a width of 10-15 nm. In various embodiments, the second line structure and the third line structure may provide a gate structure of one or more transistors. In various embodiments, a surface of the two end portions may be generally co-planar with the surface of the fuse structure and the surface of the isolation layer. In various embodiments, a surface of the second line structure may be generally co-planar with the surface of the fuse structure and the surface of the isolation layer. In various embodiments, a surface of the third line structure may be generally co-planar with the surface of the fuse structure, the surface of the isolation layer, and the surface of the second line structure.

In various embodiments, the apparatus may further include an electrical routing feature disposed on the surface of the fuse structure. In various embodiments, the recessed portion may comprise polysilicon. In various embodiments, the end portions may comprise a metal. In various embodiments, the one or more electrically conductive materials may include tungsten. In various embodiments, the isolation layer may comprise a polymer. In various embodiments, the isolation layer may comprise silicon nitride, silicon carbide, or silicon oxynitride. In various embodiments, the isolation layer may comprise silicon nitride.

According to various embodiments, the present disclosure describes methods (e.g., of forming an integrated circuit (IC) assembly). In various embodiments, the method may comprise forming, on a semiconductor substrate, a first line structure with two end portions and a recessed portion between the two end portions that defines a first recess, depositing an isolation material onto the first and second line structures, such that the isolation material substantially fills the first and second gaps and the first recess, and the isolation material has a recessed portion defining a second recess in the first recess, and forming a fuse structure in the second recess. In various embodiments, the first line structure may be disposed between two second line structures and spaced apart from the two second line structures to define a first gap between the first line structure and a first one of the two second line structures and a second gap between the first line structure and a second one of the two second line structures. In various embodiments, the recessed portion may be disposed between the first recess and the semiconductor substrate. In various embodiments, the isolation material may be deposited onto the first and second line structures such that the isolation material substantially fills the first and second gaps and the first recess. In various embodiments, a portion of the isolation material may be disposed between the fuse structure and the first line structure.

In various embodiments, depositing the isolation material may include depositing the isolation material by a conformal deposition technique, and forming the fuse structure may include depositing a metal in the second recess. In various embodiments, the method may further comprise depositing a sacrificial material onto the isolation material to fill the second recess prior to depositing the metal, and removing the sacrificial material from the second recess. In various embodiments, the method may further include removing at least one of the second line structures from the semiconductor substrate to leave a corresponding gap in the isolation material, and forming an electrically conductive line structure in the gap.

In various embodiments, forming the first line structure may include depositing a polysilicon layer on the semiconductor substrate, and patterning the polysilicon layer to form the first gap and the second gap. In various embodiments, forming the first line structure may include forming the recessed portion using an etch process. In various embodiments, the isolation material may comprise a nitride. In various embodiments, the method may further comprise forming an electrically conductive element on the fuse structure.

According to various embodiments, the present disclosure describes a system (e.g., an integrated circuit (IC) system) comprising a circuit board and a package assembly coupled with the circuit board. In various embodiments, the package assembly may include a die having a semiconductor substrate, a first line structure disposed on the semiconductor substrate and having two end portions and a first recessed portion between the two end portions, a second and a third line structure disposed on the semiconductor substrate along opposite sides of the first line structure, an isolation layer having a second recessed portion defining a second recess in the first recess, and a fuse structure disposed in the second recess. In various embodiments, the recessed portion may define a first recess in a direction toward the semiconductor substrate. In various embodiments, the second and third line structures may be spaced apart from the first line structure to define a first gap between the second line structure and the first line structure and a second gap between the third line structure and the first line structure. In various embodiments, the isolation layer may be disposed in the first gap and the second gap and further disposed in the first recess. In various embodiments, a portion of the isolation layer may be disposed between the fuse structure and the first line structure.

In various embodiments, said portion of the isolation layer may be a first portion, a second portion of the isolation layer may be disposed between the fuse structure and the second line structure, and a third portion of the isolation layer may be disposed between the fuse structure and the third line structure. In various embodiments, a surface of the fuse structure may be generally co-planar with a surface of the isolation layer that is farthest from the semiconductor substrate. In various embodiments, a distance between the fuse structure and the second line structure and a distance between the fuse structure and the third line structure may be substantially the same. In various embodiments, the fuse structure may have a width of 10-15 nm. In various embodiments, the second line structure and the third line structure may provide a gate structure of one or more transistors. In various embodiments, a surface of the two end portions may be generally co-planar with the surface of the fuse structure and the surface of the isolation layer.

In various embodiments, a surface of the second line structure may be generally co-planar with the surface of the fuse structure and the surface of the isolation layer. In various embodiments, a surface of the third line structure may be generally co-planar with the surface of the fuse structure, the surface of the isolation layer and the surface of the second line structure. In various embodiments, the system may further include an electrical routing feature disposed on the surface of the fuse structure. In various embodiments, the recessed portion may comprise polysilicon. In various embodiments, the end portions may comprise a metal. In various embodiments, the one or more electrically conductive materials may include tungsten. In various embodiments, the isolation layer may comprise a polymer. In various embodiments, the isolation layer may comprise silicon nitride.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
a semiconductor substrate;
a first line structure disposed on the semiconductor substrate, the first line structure having two end portions and a first recessed portion between the two end portions, the recessed portion defining a first recess, wherein the recessed portion is disposed between the first recess and the semiconductor substrate;
a second and a third line structure disposed on the semiconductor substrate along opposite sides of the first line structure, the second and third line structures being spaced apart from the first line structure to define a first gap between the second line structure and the first line structure and a second gap between the third line structure and the first line structure;
an isolation layer disposed in the first gap and the second gap and further disposed in the first recess, the isolation layer having a second recessed portion defining a second recess in the first recess; and
a fuse structure disposed in the second recess, wherein a portion of the isolation layer is disposed between the fuse structure and the first line structure.

2. The apparatus of claim 1, wherein said portion of the isolation layer is a first portion, a second portion of the isolation layer is disposed between the fuse structure and the second line structure, and a third portion of the isolation layer is disposed between the fuse structure and the third line structure.

3. The apparatus of claim 1, wherein a surface of the fuse structure is generally co-planar with a surface of the isolation layer that is farthest from the semiconductor substrate.

4. The apparatus of claim 1, wherein a distance between the fuse structure and the second line structure and a distance between the fuse structure and the third line structure are substantially the same.

5. The apparatus of claim 1, wherein the fuse structure has a width of 10-15 nm.

6. The apparatus of claim 1, wherein the second line structure and the third line structure provide a gate structure of one or more transistors.

7. The apparatus of claim 3, wherein a surface of the two end portions is generally co-planar with the surface of the fuse structure and the surface of the isolation layer.

8. The apparatus of claim 3, wherein a surface of the second line structure is generally co-planar with the surface of the fuse structure and the surface of the isolation layer.

9. The apparatus of claim 8, wherein a surface of the third line structure is generally co-planar with the surface of the fuse structure, the surface of the isolation layer and the surface of the second line structure.

10. The apparatus of claim 3, further including an electrical routing feature disposed on the surface of the fuse structure.

11. The apparatus of claim 1, wherein the recessed portion comprises polysilicon.

12. The apparatus of claim 11, wherein the end portions comprise a metal.

13. The apparatus of claim 12, wherein the one or more electrically conductive materials includes tungsten.

14. The apparatus of claim 1, wherein the isolation layer comprises silicon nitride, silicon carbide, or silicon oxynitride.

15. The apparatus of claim 11, wherein the isolation layer comprises silicon nitride.

16. A method comprising:
forming, on a semiconductor substrate, a first line structure with two end portions and a recessed portion between the two end portions, wherein the first line structure is disposed between two second line structures and spaced apart from the two second line structures to define a first gap between the first line structure and a first one of the two second line structures and a second gap between the first line structure and a second one of the two second line structures, the recessed portion defines a first recess, and the recessed portion is disposed between the first recess and the semiconductor substrate;
depositing an isolation material onto the first and second line structures such that the isolation material substantially fills the first and second gaps and the first recess, and the isolation material has a recessed portion defining a second recess in the first recess; and
forming a fuse structure in the second recess, wherein a portion of the isolation material is disposed between the fuse structure and the first line structure.

17. The method of claim 16, wherein depositing the isolation material includes depositing the isolation material by a conformal deposition technique, and forming the fuse structure includes depositing a metal in the second recess.

18. The method of claim 17, further comprising:
prior to depositing the metal, depositing a sacrificial material onto the isolation material to fill the second recess; and
removing the sacrificial material from the second recess.

19. The method of claim 17, further including:
removing at least one of the second line structures from the semiconductor substrate to leave a corresponding gap in the isolation material; and
forming an electrically conductive line structure in the gap.

20. The method of claim 16, wherein forming the first line structure includes:
depositing a polysilicon layer on the semiconductor substrate; and
patterning the polysilicon layer to form the first gap and the second gap.

21. An integrated circuit (IC) sys em comprising:
a circuit board; and
a package assembly coupled with the circuit board, the package assembly including a die, the die having
a semiconductor substrate;
a first line structure disposed on the semiconductor substrate, the first line structure having two end portions and a first recessed portion between the two end portions, the recessed portion defining a first recess in a direction towards the semiconductor substrate;
a second and a third line structure disposed on the semiconductor substrate along opposite sides of the first line structure, the second and third line structures being spaced apart from the first line structure to define a first gap between the second line structure and the first line structure and a second gap between the third line structure and the first line structure;
an isolation layer disposed in the first gap and the second gap and further disposed in the first recess, the isolation layer having a second recessed portion defining a second recess in the first recess; and
a fuse structure disposed in the second recess, wherein a portion of the isolation layer is disposed between the fuse structure and the first line structure.

22. The integrated circuit (IC) system of claim 21, wherein said portion of the isolation layer is a first portion, a second portion of the isolation layer is disposed between the fuse structure and the second line structure, and a third portion of the isolation layer is disposed between the fuse structure and the third line structure.

23. The integrated circuit (IC) system of claim 21, Wherein a surface of the fuse structure is generally co-planar with a surface of the isolation layer that is farthest from the semiconductor substrate.

24. The integrated circuit (IC) system of claim 21, wherein a distance between the fuse structure and the second line structure and a distance between the fuse structure and the third line structure are substantially the same.

25. The integrated circuit (IC) system of claim 21, wherein the recessed portion comprises polysilicon and the end portions comprise a metal.

* * * * *